(12) United States Patent
Rajarajan et al.

(10) Patent No.: US 7,103,527 B2
(45) Date of Patent: Sep. 5, 2006

(54) NEGOTIATED INTERCONNECTION OF VISUAL MODELING ELEMENTS

(75) Inventors: Vij Rajarajan, Redmond, WA (US); Casey L. Kiernan, Kirkland, WA (US); Stewart P. MacLeod, Woodinville, WA (US); Shawn E. Oberst, Maple Valley, WA (US)

(73) Assignee: Microsoft Corporation, Redmond, WA (US)

( * ) Notice: Subject to any disclaimer, the term of this patent is extended or adjusted under 35 U.S.C. 154(b) by 455 days.

(21) Appl. No.: 09/742,909

(22) Filed: Dec. 20, 2000

(65) Prior Publication Data

US 2002/0078433 A1 Jun. 20, 2002

(51) Int. Cl.
*G06F 9/45* (2006.01)

(52) U.S. Cl. .......................................... 703/22; 345/427

(58) Field of Classification Search ................... 703/22, 703/6; 345/20, 427, 418; 716/20
See application file for complete search history.

(56) References Cited

U.S. PATENT DOCUMENTS

| | | | |
|---|---|---|---|
| 5,130,932 A | * 7/1992 | Kaihara et al. ................ 700/97 |
| 5,838,973 A | 11/1998 | Carpenter-Smith et al. |
| 5,907,704 A | 5/1999 | Gudmundson et al. |
| 5,956,023 A | 9/1999 | Lyle et al. |
| 5,958,012 A | 9/1999 | Battat et al. |
| 5,983,218 A | 11/1999 | Syeda-Mahmood |
| 6,041,143 A | 3/2000 | Chui et al. |
| 6,054,987 A | 4/2000 | Richardson |
| 6,069,634 A | * 5/2000 | Gibson ........................ 345/424 |
| 6,233,537 B1 | * 5/2001 | Gryphon et al. ................ 703/1 |
| 6,343,377 B1 | 1/2002 | Gessner et al. |
| 6,353,448 B1 | 3/2002 | Scarborough et al. |
| 6,363,404 B1 | * 3/2002 | Dalal et al. .................. 715/513 |
| 6,384,843 B1 | 5/2002 | Harel |
| 6,418,421 B1 | 7/2002 | Hurtado et al. |
| 6,425,120 B1 | 7/2002 | Morgnaelli et al. |
| 6,430,538 B1 | 8/2002 | Bacon et al. |
| 6,448,968 B1 | * 9/2002 | Pfister et al. ................ 345/423 |
| 6,499,035 B1 | 12/2002 | Sobieski |
| 6,515,656 B1 | 2/2003 | Wittenburg et al. |
| 6,535,912 B1 | 3/2003 | Anupam et al. |
| 6,611,725 B1 | * 8/2003 | Harrison et al. .............. 700/98 |

OTHER PUBLICATIONS

Microsoft Computer Dictionary, Copyright 2002 by Microsoft Press. p. 757.*
Quatrani, "Visual Modeling with Rational Rose and UML", Addison Wesley, 3rd Printing, Apr. 1998.
Andersson et al., "Interactive Techniques for Visual Design," *Topics in Surface Modeling*, Chapter 6, American Mathematical Society, pp. 95–113 (1992).
Blake, Jeffrey, "Software Through Pictures vs. Paradigm Plus," *Advanced Systems Magazine*, pp. 84–88 (Jun. 1994).

(Continued)

*Primary Examiner*—Albert W. Paladini
(74) *Attorney, Agent, or Firm*—Law Offices of Albert S. Michalik PLLC

(57) ABSTRACT

Described is a method and system that enables open, non-proprietary and extensible visualization and modeling tools by providing multiple-way negotiations between model element end points (nodes) and a connecting model element (arc). Based on these negotiations, a user is guided to make appropriate interconnections between model elements. A protocol is provided for intelligent model elements (objects) to communicate their information to one another, e.g., an arc communicates its capabilities and requirements to a node, and vice-versa, whereby the model element objects themselves decide whether they can interconnect, and if so, how they need to interconnect. The objects themselves enforce semantics and rules. According to the protocol, either object can reject the interconnection (break off the negotiation) with the other object if it determines it is not compatible with the other object, or is otherwise unable to connect to it.

32 Claims, 8 Drawing Sheets

OTHER PUBLICATIONS

Khriss et al., "Automating the Synthesis of UML StateChart Diagrams from Multiple Collaboration Diagrams," *The Unified Modeling Language, UML '98: Beyond the Notation, First International Workshop,* pp. 132–147 (Jun. 3–4, 1998).

Paech B., "On the Role of Activity Diagrams in UML—A User Task Centered Development Process for UML," *The Unified Modeling Language, UML '98: Beyond the Notation, First International Workshop,* pp. 267–277 (Jun 3–4, 1998).

* cited by examiner

NEGOTIATED INTERCONNECTION OF VISUAL MODELING ELEMENTS

FIELD OF THE INVENTION

The present invention is generally directed to computer systems, and more particularly to visualization and modeling in computer systems.

BACKGROUND OF THE INVENTION

Visualization and modeling software is extensively used in industry. Visualization generally refers to computer tools for viewing existing layouts, such as for viewing a representation of a network topology, an electrical wiring system or various other things that are designed. Visualization has general relevance in various applications, e.g., viewing a network topology is a scenario that is applicable to many different products. Modeling refers to computer tools used to design things, such as software, databases, integrated circuits, CAD/CAM applications and the like. Thus, in general, in visualization, a user looks at interconnected model elements placed on a viewing surface. In modeling, a user places the model elements on a work surface and connects them together in some manner. The semantics of connecting two or more model elements using other model elements is the fundamental operation in modeling and visualization.

However, existing visualization and modeling tools have a number of drawbacks, including that the developers of the tools have made them closed and proprietary. For example, the file formats that store the designs are proprietary. Similarly, the rules and semantics of connecting two or more model elements together are embedded in the modeling tool. For example, an integrated circuit design tool will allow or disallow a connection between two elements based on some hard-coded knowledge about those elements. As a consequence, the tool that has the hard-coded rules and semantics, and the model elements, typically come from the same vendor, or at least come from sources having detailed knowledge of one another, resulting in a closed and proprietary tool in which independent software vendors (ISVs) or other third parties cannot participate. Moreover, existing tools are essentially not extensible, but rather require a newer version from the vendor each time updates (e.g., to modify the hard-coded rules or semantics) are required.

SUMMARY OF THE INVENTION

Briefly, the present invention provides a method and system that enables open, non-proprietary and extensible visualization and modeling tools by providing multiple-way negotiations between model element end points (nodes) and a connecting model element (arc). Based on these negotiations, a user is guided to make appropriate interconnections between model elements. This is accomplished in part by providing a protocol via which intelligent model elements (objects) communicate their information to one another, e.g., an arc communicates its capabilities and requirements to a node, and vice-versa. As a result, any software vendor can provide such model element objects, as the model element objects themselves decide whether they can interconnect, and if so, how they need to interconnect. Because the objects themselves enforce semantics and rules, instead of the tool or the framework, they are not limited to any one tool or framework, and new model element objects may be created and used with any existing framework that supports such objects.

The objects initiate the negotiation through a Visualization and Modeling Engine (VME) when the user indicates that two objects should connect, such as when the user's pointing device drags one object over the other. According to the protocol, either object can reject the interconnection (break off the negotiation) with the other object if it determines it is not compatible with the other object, or is otherwise unable to connect to it.

In one implementation, a user works with a visual modeling framework (VMF) tool to select nodes from a palette for placing on a drawing surface. When the user selects a connector (arc) element from a palette, the VMF tool provides the arc, and the user typically selects a model element from which to start the arc, i.e., a "from" node.

To initiate negotiation, when the user moves the mouse over a model element, the VMF tool notifies the model element over which the user is hovering, whereby the model element can request to negotiate with the arc. VMF provides a set of functions (e.g., methods or application programming interfaces, or APIs) that the model elements use to implement the negotiation. The negotiation usually involves finding out the kind of arc, its semantics and so forth. Negotiations also may involve other concepts, such as which side to connect from, which angle to connect at, and other criteria. If the model element being hovered on decides that this is an acceptable arc for which it can be the "from" side of a connection, it indicates this to the VMF tool. The VMF tool can highlight or otherwise change the appearance of the model element to indicate to the user that this is a valid element from which to connect, and a connector line appears on the modeling surface. When the user creates a "to" connection to another model element, similar negotiation takes place, except that this time the potential "to" node element typically requests to negotiate with both the connector element and the "from" node element. At this stage, any of the elements involved can fail the negotiations, i.e., the arc, the "from" node or the "to" node each can choose to reject the proposed interconnection.

Other advantages will become apparent from the following detailed description when taken in conjunction with the drawings, in which:

DETAILED DESCRIPTION OF THE PREFERRED EMBODIMENT

Examplary Operating Environment

Figure 1:
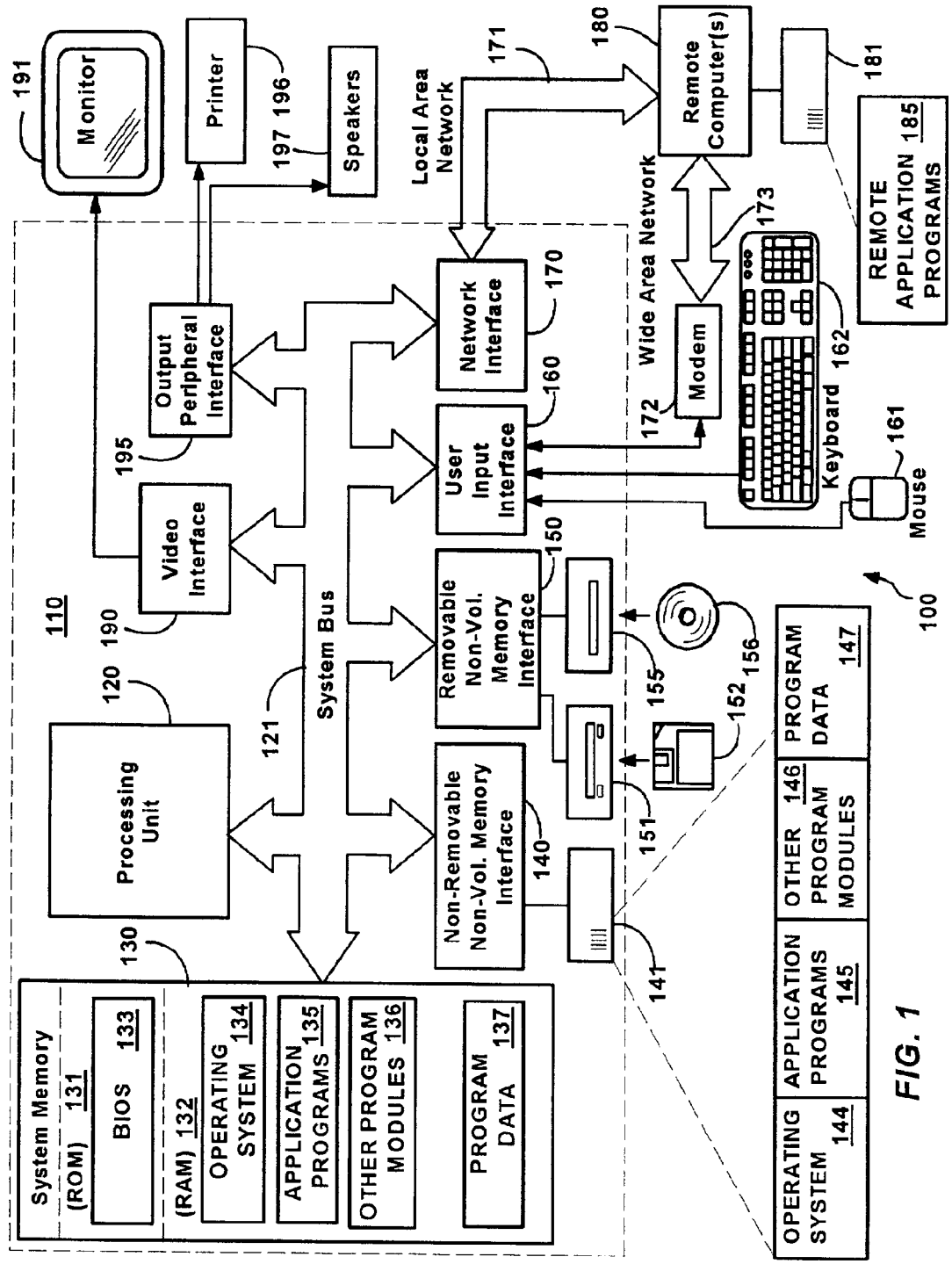
FIG. 1 is a block diagram representing a computer system into which the present invention may be incorporated.

FIG. 1 illustrates an example of a suitable computing system environment 100 on which the invention may be implemented. The computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

The invention is operational with numerous other general purpose or special purpose computing system environments or configurations. Examples of well known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The invention may be described in the general context of computer-executable instructions, such as program modules, being executed by a computer. Generally, program modules include routines, programs, objects, components, data structures, and so forth, that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

With reference to FIG. 1, an exemplary system for implementing the invention includes a general purpose computing device in the form of a computer 110. Components of the computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 110 typically includes a variety of computer-readable media. Computer-readable media can be any available media that can be accessed by the computer 110 and includes both volatile and nonvolatile media, and removable and non-removable media. By way of example, and not limitation, computer-readable media may comprise computer storage media and communication media. Computer storage media includes both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by the computer 110. Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 1 illustrates operating system 134, application programs 135, other program modules 136 and program data 137.

The computer 110 may also include other removable/non-removable, volatile/nonvolatile computer storage media. By way of example only, FIG. 1 illustrates a hard disk drive 140 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media, discussed above and illustrated in FIG. 1, provide storage of computer-readable instructions, data structures, program modules and other data for the computer 110. In FIG. 1, for example, hard disk drive 141 is illustrated as storing operating system 144, application programs 145, other program modules 146 and program data 147. Note that these components can either be the same as or different from operating system 134, application programs 135, other program modules 136, and program data 137. Operating system 144, application programs 145, other program modules 146, and program data 147 are given different numbers herein to illustrate that, at a minimum, they are different copies. A user may enter commands and information into the computer 20 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus, but may be connected by other interface and bus structures, such as a parallel port, game port or a universal serial bus (USB). A monitor 191 or other type of display device is also connected to the system bus 121 via an interface, such as a video interface 190. In addition to the monitor, computers may also include other peripheral output devices such as speakers 197 and printer 196, which may be connected through a output peripheral interface 190.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 1. The logical connections depicted in FIG. 1 include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160 or other appropriate mechanism. In a networked environment, program modules depicted relative to the computer 110, or portions thereof, may be stored in the remote memory storage device. By way of example, and not limitation, FIG. 1 illustrates remote application programs 185 as residing on memory device 181. It will be appreciated that the network connections shown are exemplary and other means of establishing a communications link between the computers may be used.

Visual Modeling Framework

Figure 2:
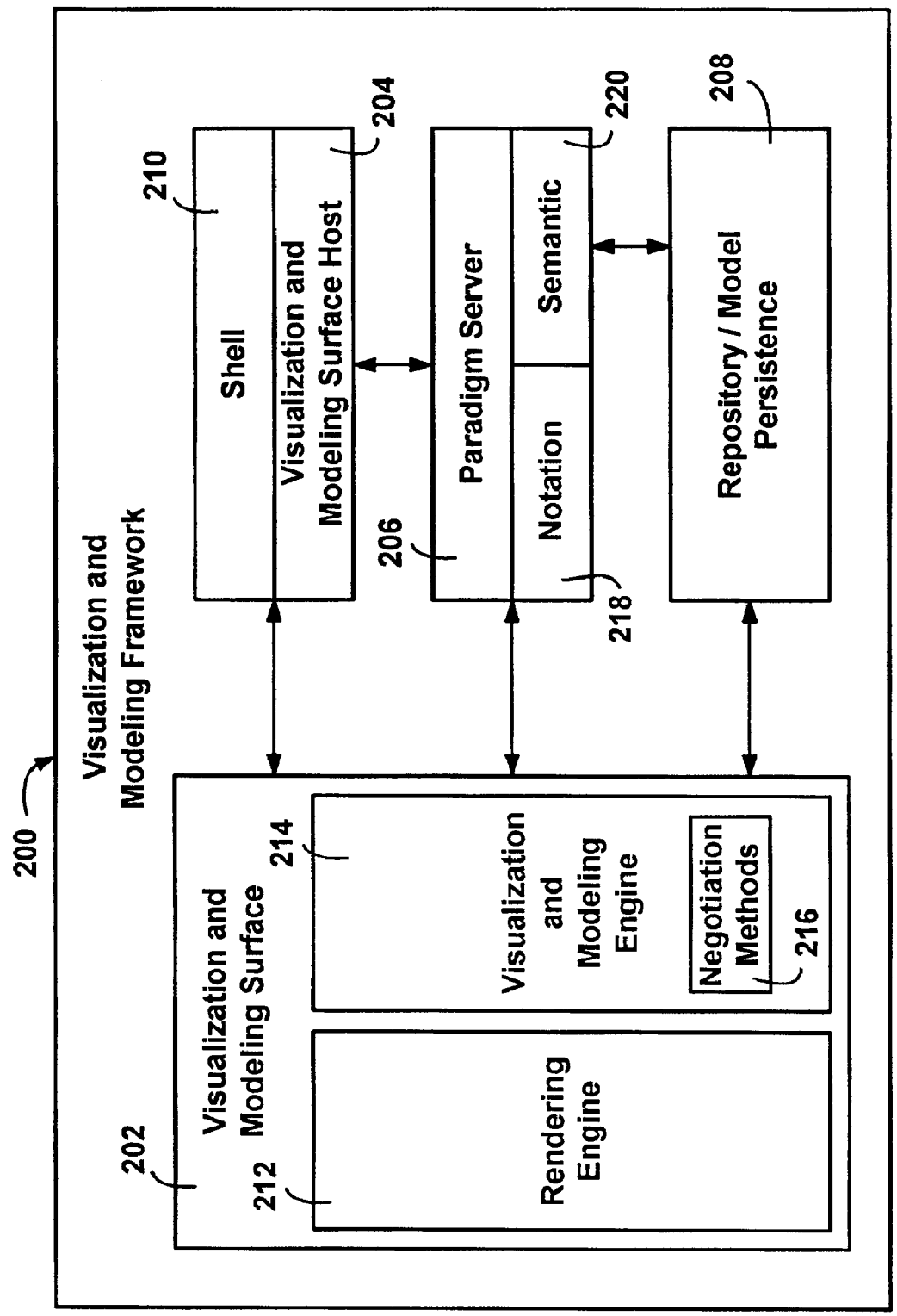
FIG. 2 is a block diagram generally representing a visualization and modeling framework (VMF) in which model elements may negotiate interconnections in accordance with an aspect of the present invention.
Figure 3:
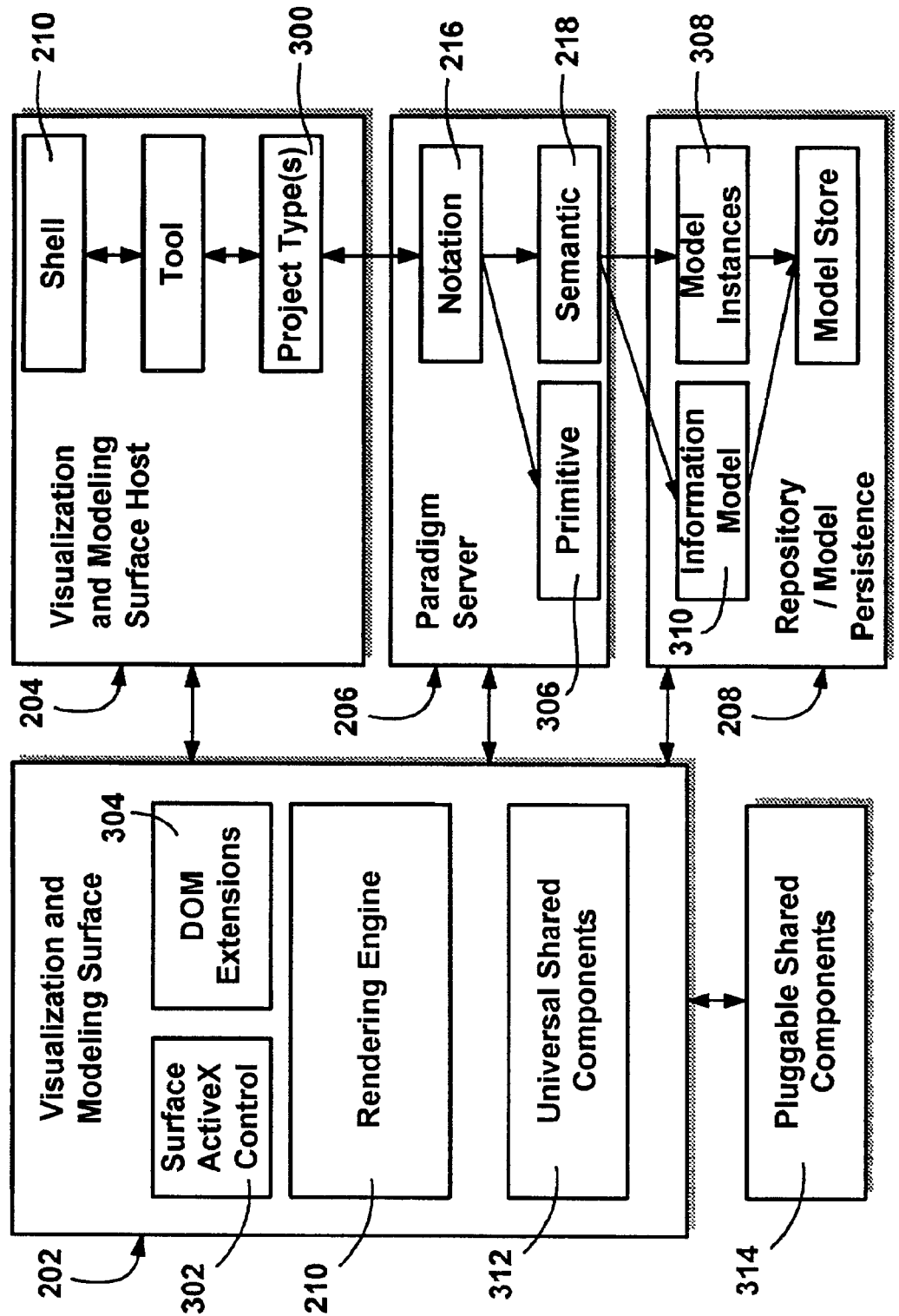
FIG. 3 is a block diagram generally representing exemplary components in the VMF by which model elements may negotiate interconnections in accordance with an aspect of the present invention.
Figure 4:
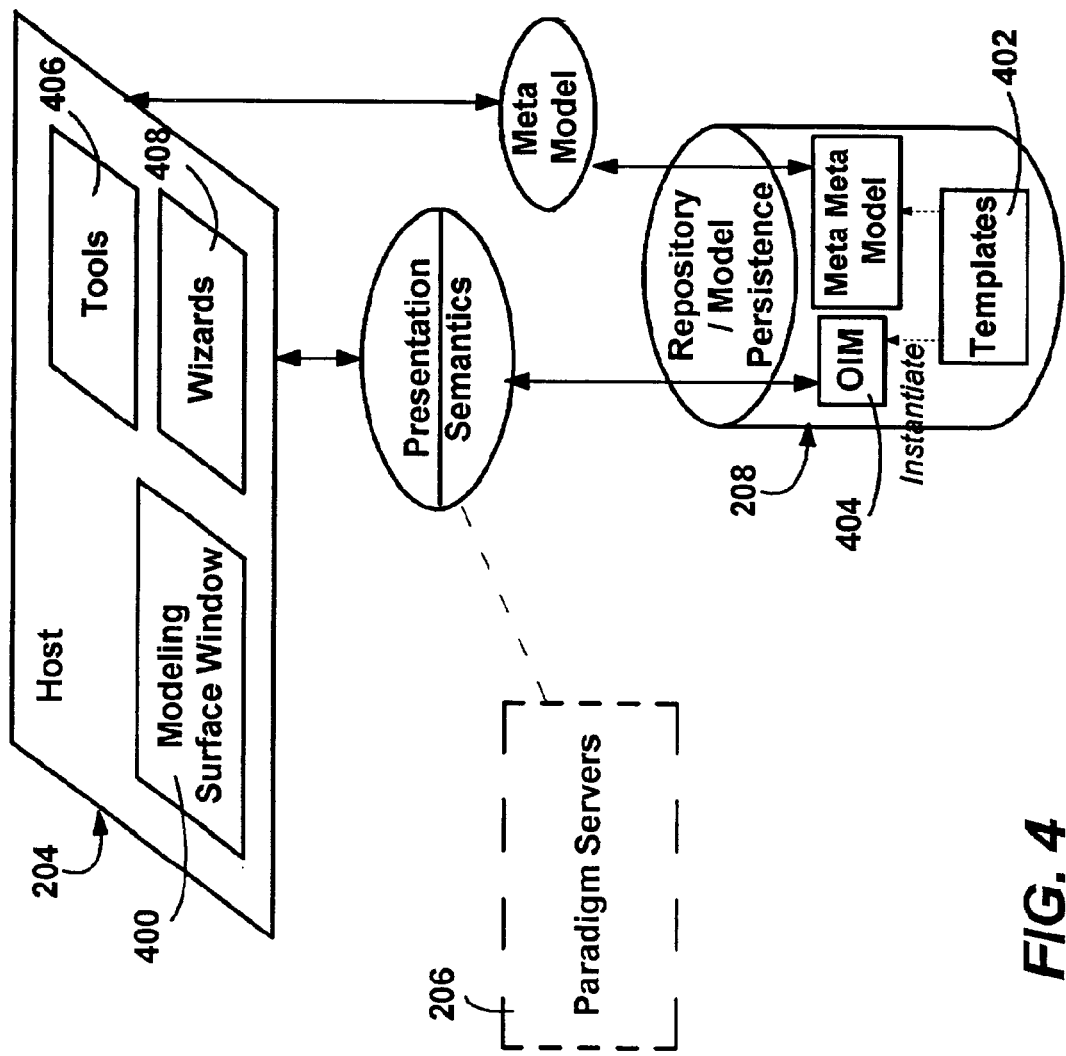
FIG. 4 is a block diagram generally representing a physical architecture of the VMF in accordance with an aspect of the present invention.

As generally represented in FIGS. 2–4, the Visualization and Modeling Framework (VMF) is a component-based framework 200 for visualization and modeling tools. VMF is a general-purpose modeling tool having a paradigm-independent surface 202 capable of modeling numerous kinds of model elements. Nevertheless, unlike other diagramming tools, VMF is still capable of enforcing model semantics and constraints.

A minimum VMF architecture requires the surface 202, a host 204 and a paradigm server 206. Model persistence, such as in the form of a repository 208, is optional, but is very likely in many modeling scenarios, for example, to maintain properties and other information for model elements. In keeping with the present invention as described below, the VMF components such as the surface 202, core graphic components and other components are designed to be reusable across modeling paradigms. For example, new model elements may be introduced by registering new paradigm servers (e.g., ActiveX® controls). Similarly, new project types may be introduced, (e.g., as ActiveX® servers). Some or all of the components that comprise the VMF 200 may be incorporated into an operating system, such as the operating system 135 (FIG. 1) of the computer 110.

The VMS host 204 is a tool that uses the services of the VMF 200 to solve a problem for the end user. In one straightforward situation, this tool may be a stand-alone executable program, wizard or add-in, with a specific problem domain for which it will provide solutions. For example, a simple host can be just a tool that hosts the surface 202 and a known paradigm server 206, e.g., a type-modeling tool may be created that utilizes a Unified Modeling Language (UML) paradigm server to model Visual Basic (VB) classes, and then generates the code for those VB classes.

A more complex host may be a generic modeling tool that may be hosted through hosting layers in a variety of host shells, such as the shell 210 (FIG. 2). Such a modeling tool may model virtually anything, using one or more registered paradigms and one or more project types 300 (FIG. 3) dedicated to solving problems utilizing those paradigms in different problem domains. More complex hosts, such as a generic modeling tool, can be hosted in a number of shells (including VS, IE, MMC, and Access) through thin hosting layers to provide shell independence. As described below, these more-complex hosts may also implement the project types 300 (like VB project types) to provide scenario-based tool support for individual sets of paradigms without compromising paradigm independence.

In the VMF architecture represented in FIGS. 2 and 3, the visualization and modeling surface 202 comprises an HTML rendering engine 212 (e.g., browser and/or editor) such as found in Microsoft Corporation's Internet Explorer product. The surface 202 thus provides a complete HTML interpreter along with HTML editing capabilities. For example, the surface supports dynamic models built from Visual Basic and C++ ActiveX® controls and behaviors, as well as static models rendered in XML/VML.

The surface 202 (which in one preferred implementation is an ActiveX® control) provides the actual drawing canvas on which model elements are arranged to form diagrams, represented in FIG. 4 as the modeling surface window 400. As described below, the surface 202 also acts as the central communication point for model elements to communicate with each other, including performing interconnection (or possibly other) negotiations in accordance with one aspect of the present invention. Most of the properties, methods and events of the surface 202 are directed to adding, editing and deleting model elements, and to managing the interactions between them. A preferred modeling surface, to be provided to third parties such as independent software vendors, is further described in U.S. patent application entitled "Dynamic, Live Surface and Model Elements for Visualization and Modeling," assigned to the Assignee of the present invention and herein incorporated by reference. Note that while this surface 202 is rich, consistent and straightforward to use, the surface 202 provides a set of defined interfaces, and is thus capable of being replaced by an arbitrary component that supports the same set of interfaces.

The surface 202 also includes a Visualization and Modeling Engine (VME) 214 that provides additional support for rendering and editing models beyond that available via the rendering engine 212. In other words, via extensions, the VME 214 provides capabilities that the rendering engine 212 does not natively provide. For example, a more sophisticated way to determine whether one model element is above or in close proximity to another model element on the modeling surface, known as four-point hit testing, is not natively handled by the rendering engine 212, but is instead provided by the VME 214. Moreover, in accordance with one aspect of the present invention and as described below, the VME 214 includes negotiation methods 216 or the like (e.g., API functions) to handle negotiating interconnections with model elements.

In one particular implementation using ActiveX® controls as represented in FIG. 3, a VMS host such as the host 204 may site the surface ActiveX® control 302, which provides standard ActiveX® interfaces to access the rendering engine 212. Any ActiveX® capability that the rendering engine 212 does not currently provide natively, such as the above-described four-point hit testing, are also provided by this surface ActiveX® control 302. Alternatively, thin clients may access most of the same capabilities of the VMS ActiveX® control with Dynamic HTML, utilizing Document Object Model (DOM) extensions 304.

As also represented in FIGS. 2–4, paradigm servers 206 provide notations and semantics to hosts, such as the VMS host 204, independent from the functional use of those notations and semantics. In one implementation, a paradigm server 206 may comprise an ActiveX® control server dedicated to providing and controlling the model elements of a single modeling paradigm. A paradigm server (e.g., 206) will often be broken apart into to separate notation and semantic servers.

In general, a notation server 218 provides the shapes of the paradigm, as well as the basic behaviors and rules for editing and connecting those shapes. Notation servers (e.g., 218) may be implemented as VB or C++ custom control servers, or, for thin clients, they may comprise "behaviors" of the rendering engine 212.

Semantic servers (e.g., 220) provide direct access to the notation independent model (meta-data represented by the model). This is particularly useful for non-graphical hosts, like wizards and generators. Semantic servers may be COM class servers or behaviors for thin clients. By way of example, one graphic primitive server (e.g., 306 of FIG. 3) provides base shapes such as lines, polygons and ellipses from which more complex shapes may be constructed, i.e., it provides basic shapes to utilize as building blocks for the more complex notation objects of a paradigm server. Typical examples of controls provided by this server include base nodes ranging from simple non-sizable icons to more complex polygons or ellipses and base arcs ranging from simple node centered non-routable single segment arcs to routable multi-segment arcs with semantic adornments. These building blocks may encapsulate both shared graphical behavior such as drawing, zooming, resizing, moving, hovering, and selecting, as well as shared modeling behavior inherent in the communication protocols with the surface, the host, semantic objects, and other notation objects. Thus, many complex behaviors such as zooming, resizing, moving and surface communication protocols are built directly into these primitive shapes, which, as can be readily appreciated, significantly simplifies the building of a notation server. Notation servers and semantic servers are further described in U.S. patent application entitled "Pluggable Notations and Semantics for Visual Modeling Elements," assigned to the Assignee of the present invention and herein incorporated by reference.

A primitive server 306 shown in FIG. 3 (such as the graphic primitive server) may also provide any shared tools that multiple notations will likely wish to implement. For example, most model elements have some text which can often be formatted, and it would be inefficient for every paradigm server to contain its own text-formatting dialog and toolbar or in-place editing textbox. The graphic primitive server thus may contain these shared tools.

As further represented in FIG. 2, model persistence 208 may be provided as a generic pluggable component for a given tool. This component may be provided by the surface 202 or through a component known to the paradigm server 206. Persistence may be meta-model driven through information models or the paradigm server may already know the schema. More reusable paradigm servers will persist through a published persistence interface on a persistence component provided by the surface 202.

Model persistence is optional. If persisted, VMF models are preferably persisted in the Open Information Model (OIM) in the persistence/repository 208, and therefore can automatically be used by existing and future tools. OIM is based on the Unified Modeling Language (UML), which is a graphical language for visualizing and modeling. A suitable persistence stream for VMF is XML/VML, however additional persistence formats, such as repository objects or database record sets, may be provided to the host. Moreover, in VMF, models are persisted through published COM interfaces for OIM and UML, whereby the actual persistence component may be easily changed from repository 208, to database tables, to XML, or the like, without effecting the paradigm servers. This component architecture maximizes flexibility and extensibility and increases the preservation of investment in the individual components as the applications of those components change.

The model persistence/repository 208 is designed to be a point of interoperability for software vendors. Any information placed in the repository 208 can be read, updated and extended by any application with appropriate access to that repository 208. Since update access is exclusively through published (e.g., COM interfaces), adding application-specific extensions through new repository interfaces does not effect those applications already leveraging the existing interfaces.

As represented in FIGS. 3 and 4, the repository 208 may contain one or more models and/or templates 402, each of which may be composed of packages for organization. Templates 402 are static instances of models in the repository 208. They are usually designed to be examples or good starting points for modeling a vertical market domain, however they can also be design patterns (model structure templates) that can be utilized by wizards to apply a standard architectural design to a model. Many templates can be built dynamically as the user needs them through wizards.

A model instance 308 includes model elements, diagrams and the projections of those model elements onto those diagrams. If the model is persisted in a versioned repository 208 then a model instance includes the versions of model elements, diagrams and projections. Information models 310 specify the schema for persisting model instances. They are meta-models of model instances and contain meta-data about those instances. For example, the repository OIM 404 specifies the interfaces for persisting types, components and database entities. The schema of a particular database may comprise a model instance 308 of this information model 310.

As also represented in FIG. 3, the surface component 202 may provide universal shared components 312 that can be shared by hosts, such as to accomplish selection, hovering, zooming, and printing functions. Larger tools that may not be required by hosts and are thus optional may be provided as separate, pluggable components 314. This reduces the footprint requirements of smaller VMF applications that may not need these components, and the physical separation also makes it easy to provide several alternative implementations of these components. By way of example, model-independent persistence, such as XML/VML persistence, is a good candidate for a pluggable component because not every host will need every persistence mechanism, and indeed, some will not require a VMF provided persistence mechanism at all. As another example, automatic graph layout is a suitable candidate for a pluggable, shared component because layout algorithms are substantially different for different classes of modeling paradigms, and yet a single layout algorithm is often useful for many or all modeling paradigms within a class. Automatic layout is further described in U.S. patent application entitled" Incremental and Interruptible Layout of Visual Modeling Elements," assigned to the Assignee of the present invention and herein incorporated by reference.

FIG. 3 also shows a representation of project types, which plug into the host 204, e.g., through an application object. Project types may be UML-like collaborations described in the OIM of the repository 208. More particularly, each project type is a collaboration of modeling paradigms, tools 406 (FIG. 4), wizards 408, command bars and templates, registered in the repository 208 and designed to be used together to accomplish a task. Command bars comprise menu bars and toolbars, and act as the hooks that link the project type into the hosting environment (the surface 202 and shell 210). The tools 406 and wizards 408 of a project type 300 may be accessed through its command bars.

Project types can support a scenario, modeling paradigm, problem domain or an entire methodology. Virtually any scenario in the software development problem space may be addressed, e.g., abstraction layers, modeling paradigms, programming languages, product layers, product architectures, vertical market domains, development lifecycle and code architectures. Project types could be linked together into larger hierarchies to support many more complex scenarios.

Model Elements—Nodes and Arcs

In general, shapes rendered on the surface are collectively referred to as model elements, (or projections). In VMF, model elements are projected onto diagrams, (which in UML terminology is somewhat analogous to a projection being a single rendering of a model element on a view element). Each model element instance projected on a diagram corresponds to exactly one model element in a repository 208, however the same repository 208 model element may be projected onto multiple diagrams or even several times onto the same diagram.

Figure 5:
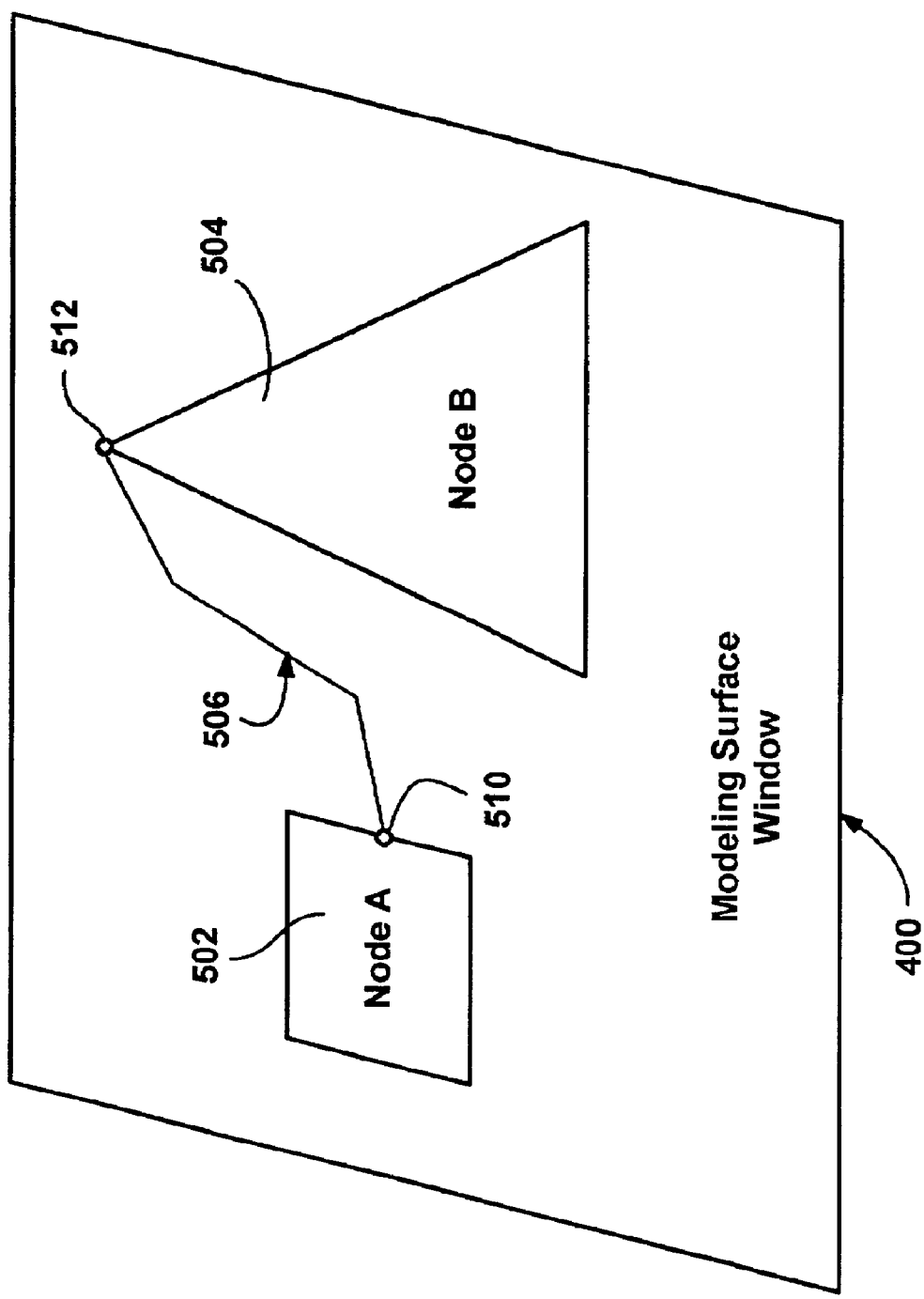
FIG. 5 is a representation of a modeling surface window having model elements thereon in accordance with an aspect of the present invention.

As generally represented in FIG. 5, each node 502, 504 is generally an icon, polygon, ellipse or other bounded shape, whereas an arc 506 is generally a line (possibly multi-segmented) that connects nodes (and sometimes other arcs) together. Arcs are used to connect two model elements together, semantically forming a relationship between the two. Model elements are typically peer ActiveX® controls on a window 400 of the surface 202. Properties of the model elements are persisted in the repository 208.

In one preferred embodiment, each model element in a model comprises an ActiveX® control. As such, each model element can autonomously control most of its presentation and much of its notational semantics. Usually, these controls will be light, windowless controls to improve scalability of models and therefore utilize the surface or graphic primitive server to provide basic windowing capability where required. Note that while the behavior of projects and diagrams is type-specific and is implemented in the project type, and the behavior of model elements and their projections is type-specific, and is implemented in one of the paradigm servers, the behavior of other elements is type-independent and is implemented in the surface server 202.

Each such model element thus also includes component interfaces, the primary purpose of which is to handle component communication between model elements, between a paradigm server and the model elements it serves, and between the surface and the model elements it contains.

As also represented in FIG. 5, the exact point where the arc touches either of these nodes is known as the attach point. In FIG. 5, the two attach points are labeled 510 and 512. The two attach points are conceptually owned by the arc but are managed by the surface 202. For example, the surface uses the attach points to determine whether other model elements may be affected when a model element is moved or resized, e.g., if a node is moved, then all of the arcs attached to that node will need to move with it. However, the surface 202 cannot move the affected model elements when an attach point moves, because it has insufficient information about how those projections should react to this move. In such an instance, the surface 202 is responsible for raising events so that each of affected model elements can respond properly to the change.

Negotiated Interconnection

In accordance with the present invention, the visualization and modeling framework 200 (FIG. 2), and in particular the visualization and modeling engine (VME) 214 of the surface 202, provides protocols and policies (e.g., negotiation methods 216) which enable appropriate interconnections to be negotiated between model elements. In general, nodes and arcs are modeling elements, and an interconnection happens between a node and an arc or between two arcs. Note that as described above, various tools can host a visualization and modeling engine, and the present invention is flexible enough to allow intelligent interconnections in virtually any scenario.

One secondary interface (VMEAttachNegotiation) that appears on arcs and nodes that can interconnect (e.g., have arcs attach to them) is for the purpose of negotiating the interconnection, or attachment. The process of establishing an attachment between one end of an arc and a node or other arc has been designed so that interconnection may be investigated and subsequently instigated or canceled by either party. The party that is investigating a possible attachment ordinarily first determines whether it is interested in attaching to the other party. For example, some arcs may only be used to attach certain types of nodes. If the node it is investigating is not one of these types, then there is no reason to continue with the negotiation. If the investigating element is interested in continuing the negotiation, then it also needs to be determined whether the investigated element is interested in attaching to it. Note that no matter which party begins a negotiation, the arc that attaches (attacher arc) is ultimately responsible for initiating the attachment with the other element (attachee). This is because the arc actually owns the attach points. It can be readily appreciated, however, that it is essentially equivalent to provide an architecture in which the node is responsible for initiation.

To accomplish negotiation in one particular COM object-based implementation, if the investigating party is the attachee, then it calls a method, QueryAttacher, via a VMEArc interface of the attacher. If the return value is true, then the attachee should determine an appropriate attach point location and then invoke a method, InitiateAttach, of the attacher's VMEArc interface. This method will create the attach point and inform the surface of the end attachment. These and other relevant methods are described further below.

If the investigating party is the attacher, then it begins by determining if the attachee supports the VMEAttachNegotiation interface. If it does not, then the attacher may not attach to this attachee and the negotiation is complete. If the attachee does support the VMEAttachNegotiation interface, then the attacher should determine an appropriate attach point location by invoking GetNearestAttachPointX and GetNearestAttachPointY methods on the attachee's VME- AttachNegotiation interface. The attacher should then call the QueryAttachee method on the Attachee's VMEAttachNegotiation interface. If the Cancel parameter is false, then the attachee has accepted the attachment. If the attacher has an adornment (symbol at the end of the arc) then they may also need to invoke the GetNearestAttachPointAngle to determine which direction this adornment should face. Finally, the attacher should initiate the attachment by creating the attach point on the surface.

Figure 6:
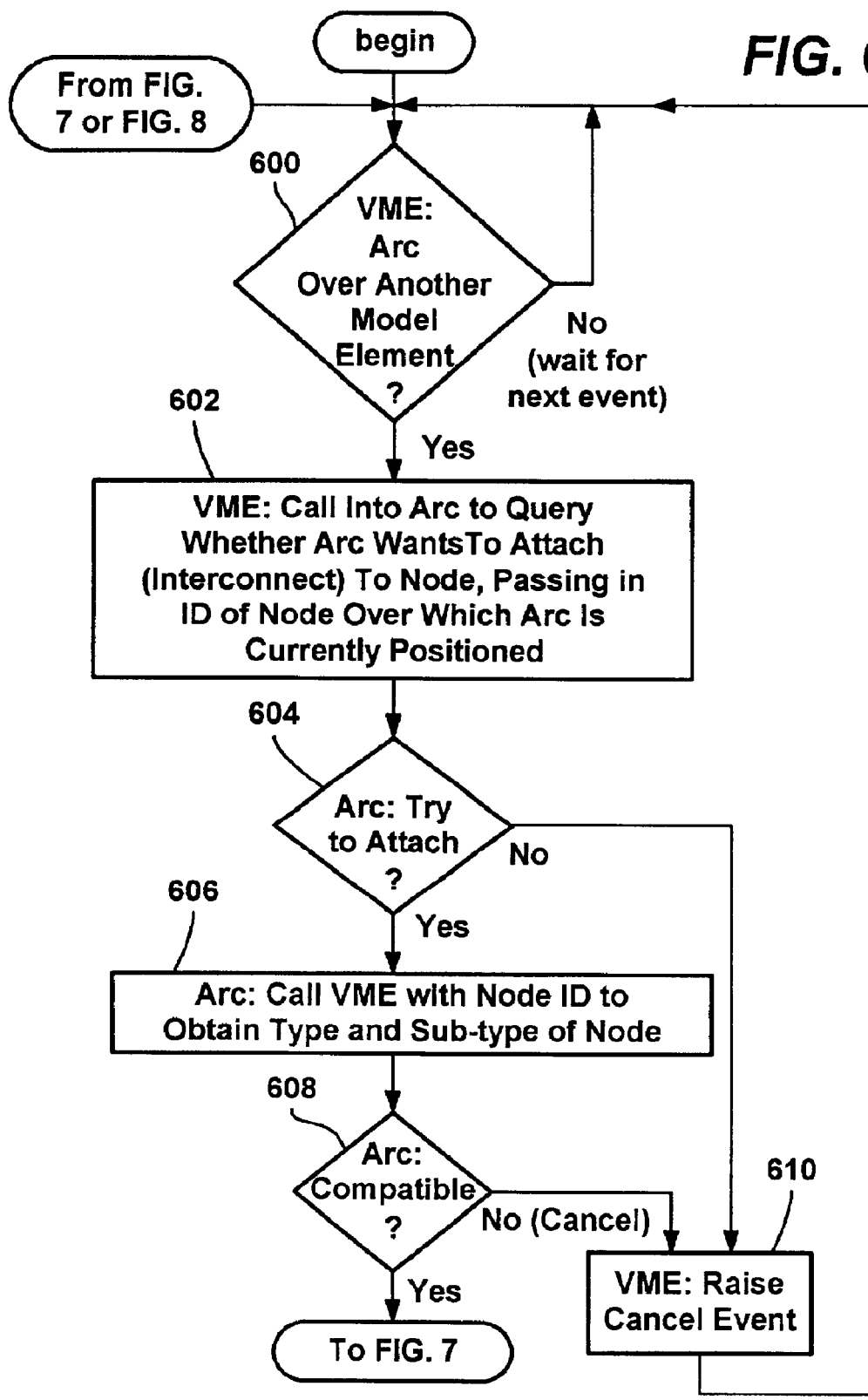
FIGS. 6–8 comprise a flow diagram generally describing a protocol used by model elements and the VMF tool when negotiating a potential interconnection in accordance with an aspect of the present invention.
Figure 7:
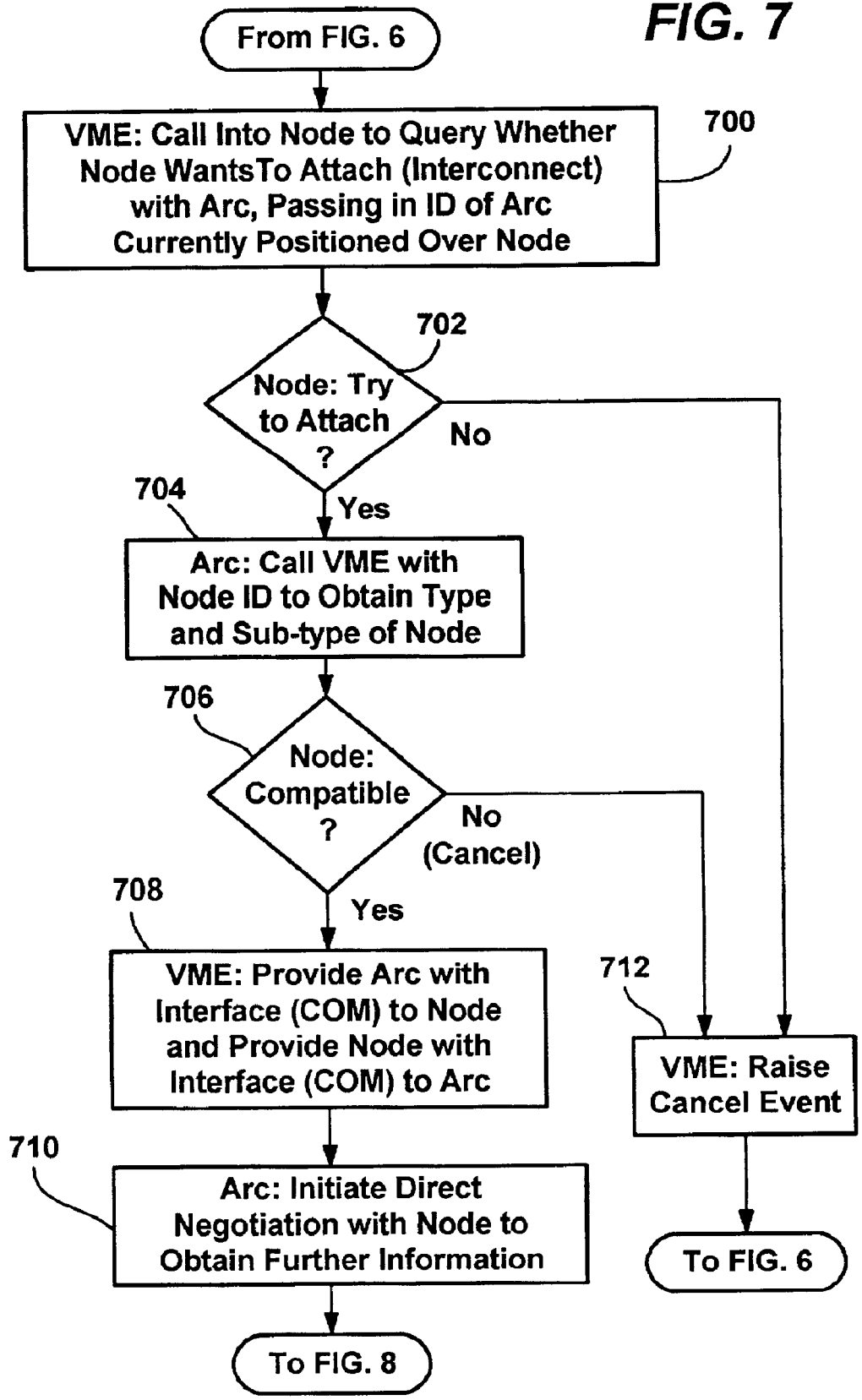

Turning to an explanation of the operation of the present invention, the flow diagram of FIGS. 5–7 and the following description generally represent what takes place when a user chooses an arc and indicates in some manner that the arc should be connected to a node, if possible. For example, the user may select an arc from a displayed palette, and via a pointing device, drag it over a displayed node to which a connection is desired. As can be appreciated, many other ways of indicating a desired connection are feasible. Note that if the arc is already connected to another node, the arc will essentially be attempting to connect the two nodes together.

As the user drags an arc object (e.g., selected from a palette) over the surface 202, the VME 214 tracks the position of the arc and checks to see if the arc is hovering over any other model element. Note that although steps 600 and 602 represent this via a loop, it is understood that such hit testing is typically event driven.

Upon detection of the arc hovering over another model element (e.g., a node) at step 600, the VME calls into the arc (step 602) and queries the arc as to whether it wants to attach (interconnect) to the node, passing in the ID of the node over which the arc is currently positioned. As generally described above, arcs and nodes are objects (e.g., COM objects), and thus along with having registered IDS, provide interfaces via which methods therein can be called. The arc can cancel the interconnection at any time, such as if it determines that it is already connected to too many other elements, and so on. If the arc does not want to attach, via step 604 the arc calls the VME to cancel negotiation. Cancellation, which raises an event, is described below with reference to step 610.

If the arc wants to attempt attachment, the arc then calls the VME 214 at step 606 to find out more about the node. For example, it ordinarily calls the VME 214 to find the type and subtype of the node. The node ID that the arc obtained from the VME 214 is used to identify and obtain this information. If the arc does not find the node type and/or subtype to be compatible with it, via step 608 the arc calls the VME 214 to cancel negotiation.

If canceled, at step 610 the VME 214 raises an event telling all interested parties (e.g., typically the node over which the arc is positioned and the tool or tools that host the VME 214) that the arc rejected the interconnection. As part of the cancellation event, the arc that rejected the interconnection, the node which was rejected, and the reason for rejection (e.g., incompatible type/subtype) are identified. Note that any time a decision is made to continue with the negotiations, (i.e., not to cancel), a suitable event indicating that acceptable negotiations are occurring can be raised by the VME, (e.g., on appropriate branches on decision diamonds in FIGS. 6–8, although for purposes of simplicity this it not separately shown herein). Parties consuming events raised during any part of the negotiations may have the power to decide the policy for interconnection. For example, the tool hosting the VME 214 typically acts as a policy authority, deciding whether to passively let the node/arc interconnect, to override the node/arc, or to give the node/arc the veto power in the negotiation. However, the tool can designate another software entity as the policy authority so that that entity consumes the negotiation events and responds. For purposes of this example, the event-consuming parties let the node and arc make their own interconnection determination.

If the arc indicates to the VME 214 that it is compatible and wants to attach, the negotiation process continues to step 700 of FIG. 7 wherein the VME 214 calls the node on which the arc is positioned to initiate a similar operation. In general, as represented by steps 700–706, if the node is interested in attaching, the node now gets the arc type/subtype and can continue or cancel negotiation. If canceled, at step 712, the VME 214 raises a similar event, this time to inform interested parties (e.g., typically the arc over the node and the tool or tools that host the VME 214) that the node rejected the interconnection. As part of the cancellation event, the node that rejected the interconnection, the arc which was rejected, and the reason for rejection (e.g., incompatible type/subtype) are identified.

If both the arc and node approve each other as compatible type/subtypes, then negotiation continues at step 708, wherein the VME 214 provides the arc with a COM interface of the node, and provides the node with a COM interface of the arc. At this time, the arc initiates direct negotiation with the node, as represented by step 710. The typical negotiation involves querying for scenario or domain-specific interfaces. For example, objects representing electrical appliances/wiring will likely implement certain interfaces directed to electrical requirements to enable deeper negotiation. Once such domain-specific interfaces are obtained, the arc can call through this interface to obtain more-domain specific information of the node to fully ensure compatibility.

The arc may also find out from the VME 214 what other interconnections a node has. The arc can then walk through, communicating with each of those connected elements to identify and get domain specific interfaces and/or information from them as part of its decision-making process as to whether to attach. For example, an arc representing an electrical wire of a certain gauge attaching to a node representing an electrical outlet can communicate with a node representing a circuit breaker to which the outlet is attached, in order to ensure that the wire does not exceeded its maximum allowed amperage.

Figure 8:
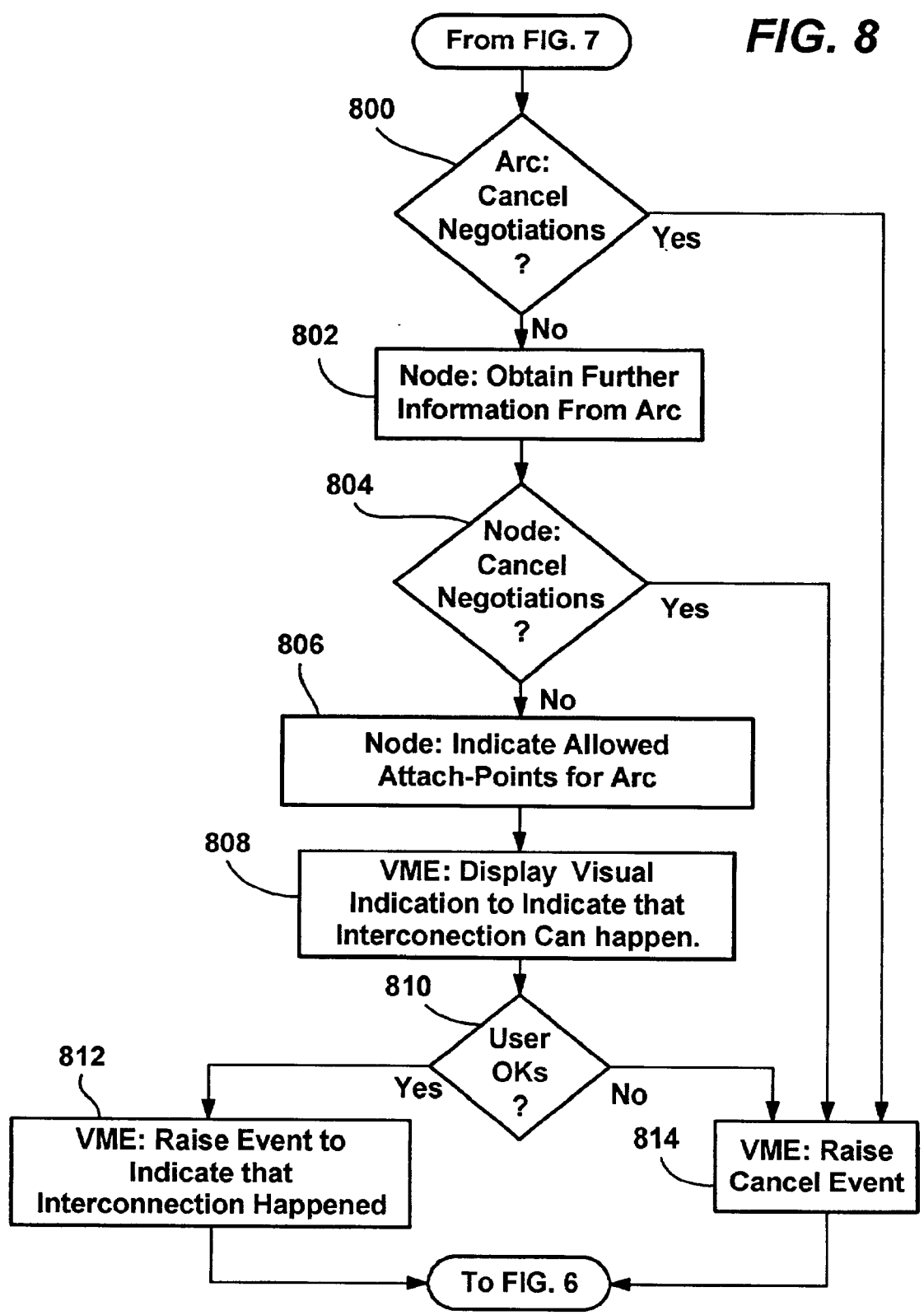

Following step 710, when the arc has communicated with the node and any other nodes and/or arcs, via step 800 of FIG. 8 the arc informs the VME 214 its acceptance or rejection of the node. If canceling, this is again raised as an event at step 814 by the VME 214 for all interested parties to receive, including relevant information as to what caused the cancellation.

Assuming negotiation has not been canceled, step 802 represents the operation performed by the node to obtain information from the arc. At this stage, the node is essentially given permission to continue with its side of the negotiation. In essence, the node performs the same process as the arc, e.g., obtaining domain specific interfaces, getting more information, including information from other connected nodes and/or arcs as desired by the node, and so forth. If at the end of the node's information-gathering process the node wants to attach, the node indicates its acceptance/rejection of the interconnection. The node can cancel or continue negotiations as represented by its decision at step 804, with a suitable event raised.

If the node wants to attach, the node also indicates its list of allowed attach-points for this arc, wherein an attach-point is the location on the node where an interconnection may be made. More particularly, a node may have multiple attach-points, each with its own significance. For example, for a triangle-shaped node, attachment on the vertices may have one meaning, whereas attachment on the sides may have another meaning. As a result, the node may need to decide where the arc should attach. Step 806 represents providing the allowed attach-points, e.g., via a list or the like. Other criteria, such as angle of attachment, may be specified.

If the negotiation results in attachment being allowable, at step 808 the tool typically provides a visual or other indication (e.g., changing the displayed color of the node) to indicate that the interconnection can happen. If the user desires interconnection as represented by step 810, the user clicks on the node or otherwise acts to effect interconnection. If the user does not effect interconnection, e.g., the user drags the arc elsewhere, the VME 214 may raise a suitable cancellation event. If the user selects interconnection, the VME 214 raises an event at step 812 to indicate that the interconnection happened.

Negotiation Methods

The following sets forth details for certain methods used in the above described negotiation process:

QueryAttacher(ProjectionId: Long): Boolean

The attachee calls this method to inquire whether the attacher will attach to it. The ProjectionId of the attachee is provided as a parameter. The actual attachee object can be obtained with this ProjectionId using the GetProjectionObject method on the IVMESurface interface. The arc this method was called on is the attacher. This method will return True if the attacher accepts the attachment and false if the attacher rejects the attachment.

QueryAttachee(ArcId: Long, X: Long, Y: Long, Cancel: Boolean)

This method is called by the attacher to request an attachment to the attachee. The ArcId parameter identifies the attacher and the X and Y parameters specify the point of attachment. The actual attacher Arc object may be retrieved using a GetProjectionObject method on the IVMESurface interface. The Cancel parameter is a return parameter. The attachee sets the Cancel parameter to True to reject the attachment and the attach operation will be canceled. The attachee should set the Cancel parameter to False to accept the attachment. The attacher is then responsible for actually initiating the attachment.

InitiateAttach(ProjectionId: Long, X: Long, Y: Long)

The attachee calls this method after a successful attach negotiation to commit the attachment. The ProjectionId of the attachee and the X and Y coordinates of the attach point are provided as parameters. The actual attachee object can be obtained with this ProjectionId using the GetProjectionObject method on the IVMESurface interface. The arc this method was called on is the attacher.

GetNearestAttachPointX(ArcId: Long, X: Long, Y: Long, NearestX: Long)

This method is called by the attacher to request the X coordinate of the closest attach point to the point specified by the X and Y parameters. This method should not be called until the attacher has already determined that the attachment is acceptable to the attachee by calling the QueryAttachee method. The ArcId parameter identifies the attacher. The X coordinate of the best attach point is returned as the NearestX parameter.

GetNearestAttachPointY(ArcId: Long, X: Long, Y: Long, NearestY: Long)

This method is called by the attacher to request the Y coordinate of the closest attach point to the point specified by the X and Y parameters. This method should not be called until the attacher has already determined that the attachment is acceptable to the attachee by calling the QueryAttachee method. The ArcId parameter identifies the attacher and the actual arc object may be retrieved using the GetProjectionObject method on the IVMESurface interface. The Y coordinate of the best attach point is returned as the NearestY parameter.

OnAttach (AttachPointId: Long)

This method is invoked automatically on the attachee's VMEAttachNegotiation interface by the surface when the attach point is added. Invoking this method makes the attachment officially complete. The attacher does not receive a similar message because the attacher always initiates the attachment and therefore is already aware. The AttachPointId parameter is the id of the newly created attach point. The attach point object with this Id may be retrieved using the GetAttachPointobject method on the IVMESurface interface.

OnDetach(AttachPointId: Long)

This method is invoked automatically on the attachee's VMEAttachNegotiation interface by the surface when the attach point is removed. Invoking this method makes the attachment officially over. The attacher does not receive a similar message because the attacher always initiates the detachment and therefore is already aware. The AttachPointId parameter is the ID of the removed attach point. The attach point object cannot be retrieved via this Id using the GetAttachPointObject method on the IVMESurface interface because the attach point no longer exists.

As can be seen from the foregoing detailed description, there is provided a negotiation method and system that eliminates many of the drawbacks resulting from the embedded rules and semantics of closed visualization and modeling tools. Via the component-based negotiations, the present invention provides significant extensibility, e.g., as new types of components are developed or as requirements change, new objects can be developed to handle such new components and/or rules, without waiting for an entire new revision of a modeling tool. Moreover, because the various objects themselves handle the negotiations, the modeling tool is able to work with a far greater variety of objects, providing significant flexibility.

While the invention is susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention.

What is claimed is:

1. A computer-readable medium having computer-executable instructions, comprising:

providing first and second modeling elements, each modeling element being adapted for negotiating connectability to one another;

initiating negotiation between the first and second modeling elements; and enabling connection between the first modeling element and the second modeling element when the first modeling element allows the connection to the second modeling element and the second modeling element allows the connection to the first modeling element.

2. The computer-readable medium having computer-executable instructions of claim 1 wherein the first modeling element comprises an arc.

3. The computer-readable medium having computer-executable instructions of claim 1 wherein the first modeling element comprises a node.

4. The computer-readable medium having computer-executable instructions of claim 1 further comprising, connecting the first model element to the second model element.

5. The computer-readable medium having computer-executable instructions of claim 4 wherein connecting the first model element to the second model element includes detecting a user request to connect.

6. The computer-readable medium having computer-executable instructions of claim 5 further comprising, raising an event indicative of the connection of the first model element to the second model element.

7. The computer-readable medium having computer-executable instructions of claim 1, wherein initiating negotiation includes providing an identifier of the first modeling element to the second modeling element.

8. The computer-readable medium having computer-executable instructions of claim 1, wherein initiating negotiation between the first and second modeling elements includes, providing an identifier of the second modeling element to the first modeling element.

9. The computer-readable medium having computer-executable instructions of claim 1, further comprising, communicating a set of at attachment criteria from the first model element to the second model element.

10. The computer-readable medium having computer-executable instructions of claim 9 wherein the attachment criteria includes at least one attach point.

11. The computer-readable medium having computer-executable instructions of claim 1, further comprising, evaluating information communicated from the first model element to the second model element to determine whether to allow the connection to the second modeling element.

12. The computer-readable medium having computer-executable instructions of claim 11, wherein the information includes object interface information.

13. The computer-readable medium having computer-executable instructions of claim 11, wherein the information includes type information.

14. The computer-readable medium having computer-executable instructions of claim 11, wherein the information includes information related to at least one other model element connected to the first model element.

15. The computer-readable medium having computer-executable instructions of claim 1, wherein the connection is enabled, and further comprising, modifying a displayed representation of the first model element to indicate the enabled connection.

16. The computer-readable medium having computer-executable instructions of claim 1, further comprising, canceling the connection.

17. The computer-readable medium having computer-executable instructions of claim 1, further comprising, canceling the connection when either the first modeling element does not allow the connection or the second modeling element does not allow the connection.

18. The computer-readable medium having computer-executable instructions of claim 1, further comprising, raising an event indicative of a possible connection between the first modeling element and the second modeling element, consuming the event at a policy authority, and canceling the connection via the policy authority.

19. The computer-readable medium having computer-executable instructions of claim 18 wherein the policy authority comprises a surface.

20. The computer-readable medium having computer-executable instructions of claim 1, wherein initiating negotiation between the first and second modeling elements comprises, receiving at the first modeling element an identifier of the second modeling element.

21. The computer-readable medium having computer-executable instructions of claim 1, wherein initiating negotiation between the first and second modeling elements includes, communicating information from a surface to the first modeling element indicating that the second modeling element is requesting possible connection.

22. A computerized modeling system comprising:
a first model element having a first communication mechanism, the first model element configured to negotiate via the first communication mechanism with other model elements for possible connection thereto;
a second model element having a second communication mechanism, the second model element configured to negotiate via the second communication mechanism with other model elements for possible connection thereto; and
a surface, the surface including a surface communication mechanism, and a negotiation mechanism configured to initiate negotiation between the first and second model elements via the surface communication mechanism.

23. The modeling system of claim 22 wherein the first model element, second model element and surface each comprise an object, and wherein the first communication mechanism, second communication mechanism and surface communication mechanism each include a set of interfaces.

24. The modeling system of claim 22, wherein the first modeling element comprises an arc and the second modeling element comprises a node.

25. The modeling system of claim 22, wherein the first and the second modeling elements each comprise an arc.

26. The modeling system of claim 22, wherein the surface negotiation mechanism is configured to raise an event.

27. The modeling system of claim 26 wherein the negotiation mechanism raises an event indicative of a possible connection between the first and the second modeling elements.

28. The modeling system of claim 26 wherein the negotiation mechanism raises an event indicative of a canceled negotiation between the first and the second modeling elements.

29. The modeling system of claim 22 further comprising a policy mechanism configured to allow or cancel negotiations.

30. The modeling system of claim 22 further comprising a mechanism configured to connect the first and second modeling element to one another.

31. The modeling system of claim 30 wherein the mechanism configured to connect the first and second modeling element to one another includes a user input device.

32. A computer-implemented method, comprising:
(a) providing first and second modeling elements, each modeling element being adapted for negotiating connectability to one another;
(b) negotiating connectability between the first and second modeling elements; and
(c) concluding the negotiation of connectability by:
(i) enabling the connection of the first modeling element to the second modeling element when the first modeling element determines that it is connectable to the second modeling element and the second modeling element determines it is connectable to the first modeling element, or
(ii) canceling the negotiation of connectability.

* * * * *